(12) United States Patent
Johnson

(10) Patent No.: US 10,544,517 B2
(45) Date of Patent: Jan. 28, 2020

(54) GROWTH OF A UNIFORMLY DOPED SILICON INGOT BY DOPING ONLY THE INITIAL CHARGE

(75) Inventor: Bayard K. Johnson, Jefferson Hills, PA (US)

(73) Assignee: GTAT IP HOLDING LLC., Merrimack, NH (US)

( * ) Notice: Subject to any disclaimer, the term of this patent is extended or adjusted under 35 U.S.C. 154(b) by 0 days.

(21) Appl. No.: 13/464,203

(22) Filed: May 4, 2012

(65) Prior Publication Data

US 2012/0279437 A1 Nov. 8, 2012

Related U.S. Application Data

(60) Provisional application No. 61/483,140, filed on May 6, 2011.

(51) Int. Cl.
| | |
|---|---|
| *C30B 15/04* | (2006.01) |
| *C30B 15/12* | (2006.01) |
| *C30B 29/06* | (2006.01) |

(52) U.S. Cl.
CPC .............. *C30B 15/12* (2013.01); *C30B 15/04* (2013.01); *C30B 29/06* (2013.01); *Y10T 117/1032* (2015.01)

(58) Field of Classification Search
CPC ......... C30B 15/04; C30B 15/12; C30B 29/06; Y10T 117/1032
USPC .......................................................... 117/21
See application file for complete search history.

(56) References Cited

U.S. PATENT DOCUMENTS

| | | | |
|---|---|---|---|
| 4,894,206 A | | 1/1990 | Yamashita et al. |
| 5,021,225 A | * | 6/1991 | Yamashita ............... C30B 15/12 |
| | | | 117/213 |
| 5,073,229 A | | 12/1991 | Yamashita et al. |
| 5,427,056 A | | 6/1995 | Imai et al. |
| 5,900,055 A | | 5/1999 | Nagai et al. |
| 2006/0254499 A1 | * | 11/2006 | Furukawa ............... C30B 15/04 |
| | | | 117/19 |

FOREIGN PATENT DOCUMENTS

| | | |
|---|---|---|
| EP | 1722014 A1 | 11/2006 |
| JP | 63-095195 | 4/1988 |

(Continued)

OTHER PUBLICATIONS

International Search Report dated Dec. 3, 2012 for PCT/US2012/036497.

(Continued)

*Primary Examiner* — Hua Qi
(74) *Attorney, Agent, or Firm* — Behmke Innovation Group LLC; James Behmke; Stephen D. LeBarron

(57) ABSTRACT

The present invention relates to a method of growing a silicon ingot comprising a dopant material having a segregation coefficient of k, wherein the concentration of the dopant is axially substantially uniform throughout the ingot. The method comprises the steps of providing a crucible having an inner growth zone in fluid communication with an outer feed zone, and the inner growth zone and the outer feed zone have cross-sectional areas that are can be used to determine conditions for maintaining dopant uniformity for the specific dopant material used. A crystalline growth system for growing at least one uniformly doped silicon ingot is also disclosed.

3 Claims, 6 Drawing Sheets

(56) References Cited

FOREIGN PATENT DOCUMENTS

| JP | 1-215789 | 8/1989 |
| JP | 3-092774 U | 9/1991 |

OTHER PUBLICATIONS

Office Action dated Jul. 3, 2015 in connection with Chinese Application No. 201280030859.6.
Translation of Chinese Office Action.
Office Action dated Aug. 21, 2015 in connection with Japanese Application No. 2014-509471, with English translation.

\* cited by examiner $$M_L \frac{dC_L}{dt} = (C_F - kC_L)\frac{dM_x}{dt} + (C_F - C_L)\frac{A_s}{A_t}\left(\frac{dM_F}{dt} - \frac{dM_x}{dt}\right) - gA_f C_L$$

Assumptions:

$\frac{dC_L}{dt} = 0$     Objective: uniform concentration $C_F = 0$     No dopant in the feed $\frac{dM_x}{dt} = \Psi \neq \frac{dM_F}{dt}$     Mass solidification and mass feed rates are not necessarily equal. Define $\Psi$ equal to the mass solidification rate.

Sub into the above and find the required ratio of feeding to solidification:

No evaporation (g=0)

$\frac{dM_F}{dM_x} = 1 - k\frac{A_t}{A_s} - \frac{gA A_f}{\Psi A_s}$    Eqn. 6      $\frac{dM_F}{dM_x} = 1 - k\frac{A_t}{A_s}$    Eqn. 7

FIG. 3

$$M_L \frac{dC_L}{dt} = (C_F - kC_L)\frac{dM_x}{dt} + (C_F - C_L)\frac{A_s}{A_t}\left(\frac{dM_F}{dt} - \frac{dM_x}{dt}\right) - gA_f C_L$$

Assumptions:

$\frac{dC_L}{dt} = 0$     Objective: uniform concentration $\frac{dM_F}{dt} = 0$     No feeding Sub into the above and find the required dopant concentration in the outer annulus $$\frac{C_F}{C_L} = \frac{k - \frac{A_s}{A_t} - \frac{gA_f}{\Psi}}{1 - \frac{A_s}{A_t}} \quad \text{Eqn. 8}$$

No evaporation (g=0)

$$\frac{C_F}{C_L} = \frac{k - \frac{A_s}{A_t}}{1 - \frac{A_s}{A_t}} \quad \text{Eqn. 9}$$

FIG. 4

GROWTH OF A UNIFORMLY DOPED SILICON INGOT BY DOPING ONLY THE INITIAL CHARGE

CROSS-REFERENCE TO RELATED APPLICATIONS

The present application claims the benefit of U.S. Provisional Patent Application No. 61/483,140, filed May 6, 2011.

BACKGROUND OF THE INVENTION

1. Field of the Invention

The present invention relates generally to growth of crystalline materials and, in particular, to Czochralski growth of doped silicon.

2. Description of the Related Art

The technology of growing crystalline silicon ingots according to the Czochralski (CZ) method has been extensively developed over many decades to supply silicon wafers to the integrated circuit (IC) industry and the photovoltaic (PV) solar industry. In the Czochralski method, a crucible composed of a refractory material such as fused quartz and containing silicon is heated to the melting point of silicon at around 1416° C. to produce a silicon melt in the crucible. A seed of crystalline silicon of predetermined crystallographic orientation is lowered to barely contact the melt. Molten silicon freezes on the seed with the same orientation. The seed is slowly withdrawn from the melt and the process continues to grow an ingot of monocrystalline silicon having a diameter of perhaps 200 or 300 mm and a length of a meter or more. After drawing, the ingot is sliced to produce silicon wafers, which are then further processed to produce IC's or PV solar cells.

The IC industry predominantly relies on the batch Czochralski process in which a crucible is initially charged with silicon shards, chunks, or pellets of very high purity and then heated to the silicon melting point. Typically, after the growth of one silicon ingot, the crucible is discarded and replaced by a fresh crucible. Although the PV solar industry has utilized batch CZ silicon wafers, continuous Czochralski (CCZ), more accurately called semi-continuous CZ, has been proposed in which during the growth of an ingot the crucible is continuously or at least intermittently supplied with silicon feedstock such that the level of silicon melt in the crucible remains substantially constant. After a normal sized ingot has been drawn from the crucible, another ingot can be drawn by using a new seed or reusing the previous seed. The process may be repeated for a substantial number of ingots determined by factors such as accumulation of impurities or degradation of the crucible. The CCZ process reduces the cost of crucibles, increases manufacturing throughput, and in some respects simplifies the thermal control along the length of the ingot. However, CCZ also requires resupply directly into the hot crucible while it is growing crystalline silicon.

Wafers, including wafers destined for solar applications, are preferentially grown doped to a desired conductivity type and dopant concentration, usually simply measured by resistivity. The fabrication of doped silicon wafers of one conductivity types allows the formation of a p-n junction by the diffusion or implantation of a layer of dopant of the other conductivity type. Semiconductor dopants are well known, most particularly boron (B) for p-type and phosphorous (P) for n-type although gallium (Ga) offers many advantages as a p-type dopant for solar cells.

Doped silicon can be grown according to the CZ method by including in the melt a required level of the dopant, and the dopant is incorporated from the melt into the silicon ingot along with the silicon. Doping concentrations relative to silicon are typically much less than 1 ppma (part per million atomic). However, the process is complicated by the segregation effect according to which, if the concentration of a dopant in the melt is C, the dopant concentration in the solidified ingot is kC, where k is the segregation coefficient, which is usually less than one and often much less than one. Segregation coefficients for several dopants in silicon are given in TABLE 1.

TABLE 1

| Element | k |
|---------|--------|
| B       | 0.8    |
| P       | 0.35   |
| Ga      | 0.008  |
| In      | 0.0004 |
| As      | 0.3    |
| Al      | 0.002  |

For batch CZ, the dopant can often be charged into the cold crucible together with the solid silicon feedstock and the two melted together as the crucible is heated to the silicon melting point. However, the segregation effect causes a larger fraction of silicon than of the dopant in the melt to be supplied to the growing ingot. Although the dopant concentration in the pre-charge can be adjusted to produce the desired doping in the ingot, the segregation effects causes the concentration of the dopant to gradually increase in the melt as the crystal grows and the melt is depleted. As a result, the later portions of the ingot have a higher dopant concentration (lower resistivity) than the initial portions. In batch CZ, gallium doping can vary by a factor of ten and boron doping can vary by about 30%. Such axial variation (i.e., along the length of the ingot) is not desired since the resistivity of wafers then depends upon their position within the ingot. Because solar panel performance is negatively affected by cell non-uniformity, cell manufactures include costly wafer sorting steps in their fabrication lines. Uniformity of the wafer supply can help in eliminating these steps. Another application that would benefit from this invention is the making of heavily doped rods of uniform resistivity that can be sectioned and mixed as solid with feedstock in subsequent CZ manufacturing processes to make rods of relatively lower dopant concentration and higher resistivity.

In continuous CZ, an amount of dopant which, when melted, provides a desired concentration in the liquid may be supplied together with the fresh silicon feedstock in order to maintain a constant dopant concentration in the melt and thus assure a constant axial resistivity within each ingot and a constant resistivity among ingots. However, the continuous resupply of dopant in elemental form in CCZ presents difficulties arising from the lower melting points of most dopants relative to silicon and the need to separately meter controllable amounts of dopant into the hot crucible. Gallium presents particular difficulties because of its melting point of about 30° C. and its very low segregation coefficient. Continuous doping with elemental dopants, such as boron and phosphorous that are typically in powder form, is also quite difficult in practice.

Accordingly, better and more economical methods and apparatus are desired for the Czochralski growth of ingots with axially uniform resistivity.

SUMMARY OF THE INVENTION

The present invention relates to a method of growing a silicon ingot comprising a dopant material having a segregation coefficient of k. The method comprises the steps of providing a crucible having an inner growth zone in fluid communication with an outer feed zone; providing an initial charge in the inner growth zone and the outer feed zone, the initial charge in the inner growth zone comprising silicon and the dopant material and the initial charge in the outer feed zone comprising silicon; melting the silicon and dopant material in the inner growth zone to form a melted mixture and the silicon in the outer feed zone to form a silicon melt, the melted mixture and the silicon melt having upper melt surfaces at substantially similar heights; growing the silicon ingot from the inner growth zone; and removing the grown silicon ingot. The resulting ingot comprises the dopant material in an axially substantially constant concentration, and, in various embodiments of the method, the crucible geometry, particularly the inner growth zone and the outer feed zone cross-sectional areas, are used to determine conditions for maintaining dopant uniformity for the specific dopant material used. The present invention further relates to a crystalline growth system for growing at least one silicon ingot comprising a dopant material having a segregation coefficient of k, wherein the silicon ingot comprises the dopant material in an axially substantially constant concentration.

It is to be understood that both the foregoing general description and the following detailed description are exemplary and explanatory only and are intended to provide further explanation of the present invention, as claimed.

BRIEF DESCRIPTION OF THE DRAWINGS

FIG. 1-FIG. 4 show derivations of equations relating to various embodiments of the method and growth system of the present invention. FIG. 1 and FIG. 2 also include schematic views of embodiments of a Czochralski growth system and method of the present invention.

DETAILED DESCRIPTION OF THE INVENTION

Figure 1:
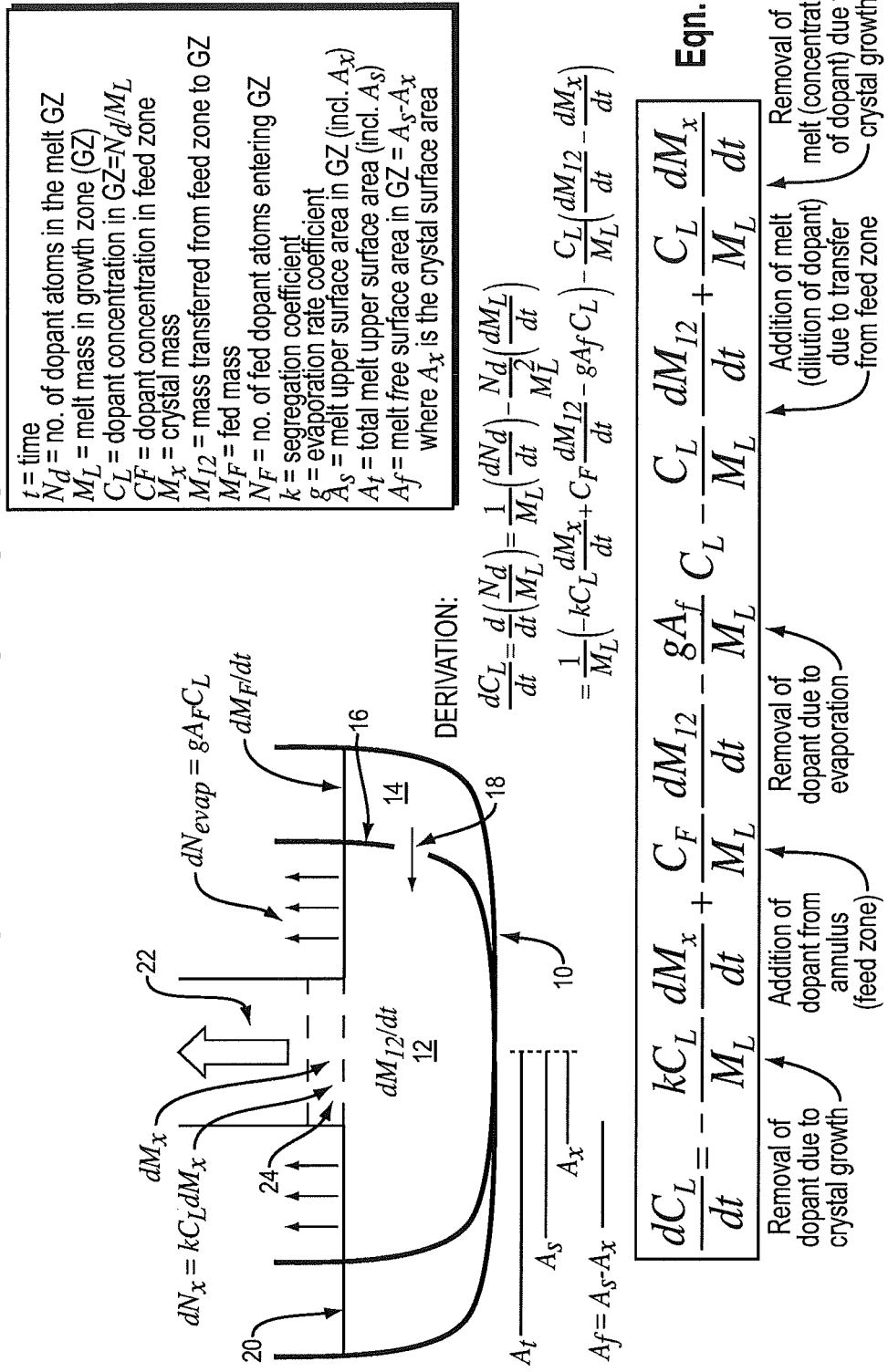
Figure 2:
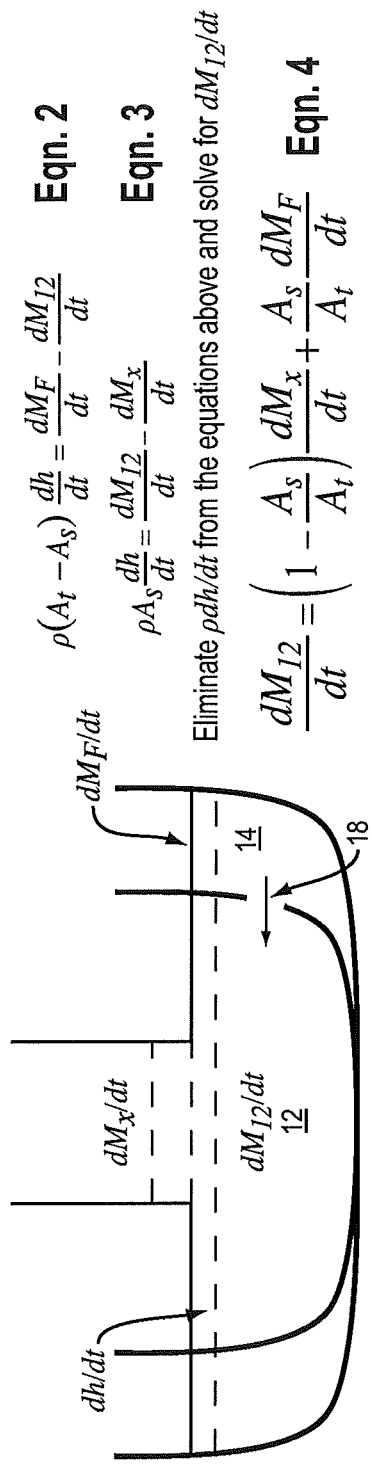

The present invention relates to methods of crystal growth of a silicon ingot, as well as to crystal growth systems and ingots produced therefrom.

The present invention allows manufacturing of silicon ingots with axially uniform dopant profiles without supplying additional dopant material during ingot growth. Aspects of the invention result from a detailed analysis of silicon and dopant flow during Czochralski (CZ) growth, particularly in a multi-wall crucible.

In more detail, the present invention relates to a method of growing a crystalline material, particularly a Czochralski growth method. The method of crystal growth comprises the steps of providing a crucible having a growth zone in fluid communication with a feed zone, pre-charging the crucible with feedstock material and dopant material, melting the initial charge, and growing an ingot of crystalline material that is subsequently removed from the system. The resulting crystalline ingot is axially uniform in dopant concentration—that is, the ingot has a substantially constant concentration along its vertical axis. This can be determined using any method known in the art, particularly using known resistivity measurements. Thus, for example, the resulting crystalline ingot has axially uniform resistivity. By uniform resistivity or dopant concentration is meant that the resistivity or dopant concentration is within ±20% or more preferably to within ±10%.

The crucible used in the method of the present invention has a growth zone in fluid communication with feed zone. Thus, the crucible is a multi-zoned crucible. The crucible can be any known for use in crystal growing that is capable of containing both solid and liquid feedstock, particularly silicon. For example, the crucible can be a quartz crucible or can be a graphite crucible containing a quartz inner liner. The crucible can also have any cross-sectional shape depending, for example, on the geometry of the crystal growth system used, but typically has a circular cross-sectional shape. Preferably, the crucible has an inner growth zone within an outer feed zone, and the inner growth zone is in fluid communication with the outer feed zone. For example, the crucible can comprise a wall or other separating means that divides the crucible into the inner and outer zones. The separator can have an opening, such as a hole or pipe, which provides restricted fluid communication between the two zones so that, as material is removed from the inner growth zone by the crystallization process, fresh material can enter from the feed zone. The inner growth zone and the outer feed zone have cross-sectional areas whose ratio can be used to determine the procedure for maintaining dopant uniformity, discussed in more detail below.

In the method of the present invention, a pre-charge is provided into the zones of the crucible prior to initiating growth of the silicon ingot. For example, an initial charge comprising silicon, such as electronic grade silicon, metallurgical grade silicon, or solar grade silicon, is provided in both the inner growth zone and the outer feed zone of the crucible. In addition, dopant material is also pre-charged into the growth zone of the crucible. Any dopant known in the art can be used, including, for example, n-type dopants such as phosphorus and p-type dopants such as boron, gallium, indium, or aluminum.

The charge in the crucible is then heated to a temperature above the melting point of the charge whereby the pre-charge in the growth zone, comprising feedstock, such as silicon, and dopant material, forms a melted mixture, and the pre-charge in the feed zone, comprising feedstock, such as silicon, forms feedstock melt. Any method known in the art can be used to melt the pre-charges. Since the growth zone of the crucible is in fluid communication with the feed zone, when melted, the melted mixture and the feedstock melt have upper melt surfaces at substantially similar heights. Once melted, at least one crystalline ingot is then grown from the melted charge in the growth zone and subsequently removed for further processing.

As described above, a crystalline ingot having axially constant dopant concentration can be grown based solely on the knowledge of the dopant segregation coefficient and the geometry of the crucible. Various embodiments of this method result from a detailed analysis of the melt flow between the zones, which are in fluid communication with each other, and this is shown in FIG. 1-FIG. 4.

In particular, a Czochralski growth system is schematically illustrated in the cross-sectional view of FIG. 1. Double-wall crucible 10 comprises inner circular growth zone 12 of radius $r_s$ and liquid upper surface area $A_s$ and outer annular feed zone 14 of outer radius $r_r$, liquid total upper surface area $A_f$, and annular area ($A_f$-$A_s$) separated from inner growth zone 12 by a wall 16. Hole 18 in wall 16 provides limited fluid connection from outer feed zone 14 to the inner growth zone 12. Hole 18 assures a nearly level upper melt surface 20 in both the growth and feed zones. Optionally, one or more additional walls with associated holes can be used to produce additional zones with limited fluid communication, particularly from the outermost to the central zone.

Unillustrated heaters initially heat the solid feedstock, for example, silicon, and possible dopants pre-charged into the cold crucible to the melting point, and maintain the temperature at or just above the melting point for crystal drawing. Ingot 22 having a diameter D or radius $r_x$ has a cross-sectional area $A_x$ in contact with the melt in inner growth zone 12 from solidification region 24. Assuming that the mass of dopant is much less than the mass of feedstock in which the dopant is dissolved, the solidification (growth) mass flow (rate of mass change) from inner growth zone 12 to ingot 22 is $dM_x/dt$, and the transferred mass flow from outer feed zone 14 to inner growth zone 12 through hole 18 is $dM_{12}/dt$. Also, if needed, a feed comprising additional feedstock can be used, and the feed mass flow into outer feed zone 14 of solid or liquid silicon feedstock, which may be zero, is $dM_F/dt$. It is assumed that there is no significant reverse flow through hole 18. The present invention allows the level of upper melt surface 20 of the melt to vary during the growth of the ingot 22.

Turning now to dopant concentrations, the dopant concentration in inner growth zone 12 is $C_L$ whose rate of change is given by Eqn. 1 shown in FIG. 1. It is desired that $C_L$ is constant in time during ingot growth if ingot 22 is to have an axially constant dopant concentration and resistivity (i.e., $dC_L/dt=0$ in Eqn. 1). The time rate of change dh/dt of the level of upper melt surface 20 in both the growth and feed zones is given respectively by Eqn. 2 and Eqn. 3 shown in FIG. 2. However, the two rates must be the same because of the fluid communication through hole 18. Therefore, these two equations can be combined into Eqn. 4 shown in FIG. 2. Substitution into Eqn. 1 shown in FIG. 1 and rearrangement results in Eqn. 5 shown in FIG. 2. Various embodiments of the present invention result from specific conditions applied to Eqn. 5.

In a first embodiment of the method of the present invention, shown in FIG. 3, uniform doping is obtained, that is, $dC_L/dt=0$, with the use of a continuous feed of feedstock such as silicon, but without continuous doping. Thus, this embodiment is a continuous Czochralski growth method in which, for example, silicon and dopant material are pre-charged into the inner growth zone, silicon is pre-charged into the outer feed zone with no dopant material so that $C_F=0$, and a feed of silicon is delivered to the outer feed zone as the silicon ingot is grown. Then, for this embodiment, the ratio of the feed mass flow rate (the rate at which the feed is delivered to the crucible) to the growth mass flow rate (the rate at which the ingot is grown) is given by Eqn. 6. If evaporation of the dopant material from the inner growth zone is substantially equal to zero (i.e., the evaporation rate coefficient is approximately zero), such as for boron and phosphorous, then the ratio of the rate of silicon feed to the rate of ingot growth is given by Eqn. 7. Note that Eqn. 7 is independent of the dopant concentration, $kC_L$, that is desired or targeted for the resulting final ingot as well as the solidification rate. Rather, for this embodiment of the method of the present invention, the ratio of feed rate to ingot growth rate depends only upon the crucible geometry and the segregation coefficient of the dopant material. The relevant feature of the crucible geometry is the area ratio $A_f/A_s$ of the outer and inner zones of the crucibles at the melt height or, for a circular crucible, either their squared radius ratio $r_f^2/r_s^2$ or equivalently their squared diameter ratio $D_f^2/D_s^2$. Eqn. 6 additionally depends on the evaporation rate, ingot diameter, and pull rate. For a crucible having walls with radii varying with height (i.e., tapered, such as from the top to the bottom), then the area ratio can be adjusted for height, or, alternatively, the vertically tapering of the inner and outer crucible can be tailored to produce an axially unvarying area ratio.

Thus, according to this first embodiment, the ratio of feeding silicon feedstock to the outer feed zone to solidification mass flow is determined based on specific crucible geometry characteristics and knowledge of the segregation coefficient of the dopant material in the crystalline material used to grow the ingot, according to Eqn. 6 or Eqn. 7 shown in FIG. 3. For this embodiment, the inner growth zone of the crucible is pre-charged with feedstock, such as silicon, and further includes the dopant material, which, when melted with the feedstock, is in concentration of $C_L$. The outer feed zone is also pre-charged, but this solid pre-charge includes no dopant material. Loading solid or even liquid dopant at room temperature presents little difficulty. The solid pre-charges in both zones, when melted, must have equal initial surface levels. Also, feedstock should be continuously or at least intermittently supplied to the melt in the outer feed zone, and no dopant material is needed in the feed.

In a second embodiment of the method of the present invention, shown in FIG. 4, uniform ingot doping is obtained, that is, $dC_L/dt=0$ and neither silicon nor dopant is fed into the during ingot growth, so that $dM_F/dt=0$. Thus, this second embodiment is a batch Czochralski growth method in which both the inner growth zone and the outer annular feed zone are pre-charged with both feedstock such as silicon, and with dopant material. The ratio of the concentration of pre-charged dopant in the outer feed zone to the concentration of pre-charged dopant material in the inner growth zone, $C_F/C_L$, is given by Eqn. 8 shown in FIG. 4 for the evaporative situation (i.e., dopant materials having a non-negligible evaporation rate coefficient) and by Eqn. 9 shown in FIG. 4 when evaporation is not important (i.e., dopant materials having an evaporation rate coefficient, g, that is approximately equal to zero), such as for boron and phosphorous. These ratios should remain constant during ingot growth. For this second embodiment of the method of the present invention, the ratio of Eqn. 9 depends only on crucible geometry and the segregation coefficient of the dopant material.

Thus, according to this embodiment, the growth and feed zones are pre-charged with amounts of solid silicon giving initial equal melt levels and with amounts of dopant giving dopant concentrations respectively of $C_L$ and $C_F$, and the ratio of these concentrations is determined based on the specific crucible geometry characteristics and knowledge of the segregation coefficient of the dopant material in the crystalline material used to grow the ingot, according to Eqn. 8 or Eqn. 9 shown in FIG. 4. Low temperature pre-charging of dopants should present few difficulties, and the absence of a continuous silicon feed greatly simplifies the growth chamber design and operation.

It is anticipated that the growth zone is supplied with solid silicon feedstock and dopants only when it is cold and, once the silicon is exhausted, growth stops and the crucible is replaced by a fresh one. This process closely resembles conventional batch Czochralski operations, but there are partitions in the crucible. If sufficient silicon remains in the melt after the growth of one ingot, a second or further ingot can be grown from the melt, which is now at a reduced melt level. Alternatively, feeding and doping could be performed between crystals and the batch-like growth process could then be repeated.

A third embodiment of the method of the present invention is a special case of either of the first two embodiments. As discussed above, the first embodiment is a continuous Czochralski growth method in which silicon and dopant material are pre-charged into the inner growth zone and silicon is pre-charged into the outer feed zone with no dopant material. In addition, a feed of silicon is delivered to the outer feed zone as the silicon ingot is grown. If the same conditions are used, but no feed of silicon is delivered (i.e., $dM_F=0$), then, based on Eqn. 7, $k(A_t/A_s)=1$ and therefore $A_s/A_t=k$. These same conditions also apply to the second embodiment, wherein no dopant material is pre-charged in the outer feed zone—i.e., the concentration of dopant material in the outer feed zone is zero ($C_F=0$). Based on Eqn. 9, for this case also, $k(A_t/A_s)=1$ and $A_s/A_t=k$. Thus, assuming no evaporation of the dopant material, if the area ratio equals the segregation coefficient, neither pre-charging of the dopant in the annular feed zone nor continuous feeding of silicon feedstock is required. Thus, using this embodiment of the method of the present invention, if a crucible has an area ratio that is equal to the segregation coefficient, an ingot having a uniform dopant concentration can be produced without either feeding undoped silicon or adding dopant to the outer feed zone. In operation, variations in the ratio from k in the amount of ±10% or ±20% should enjoy many of these same advantages.

Figure 5:
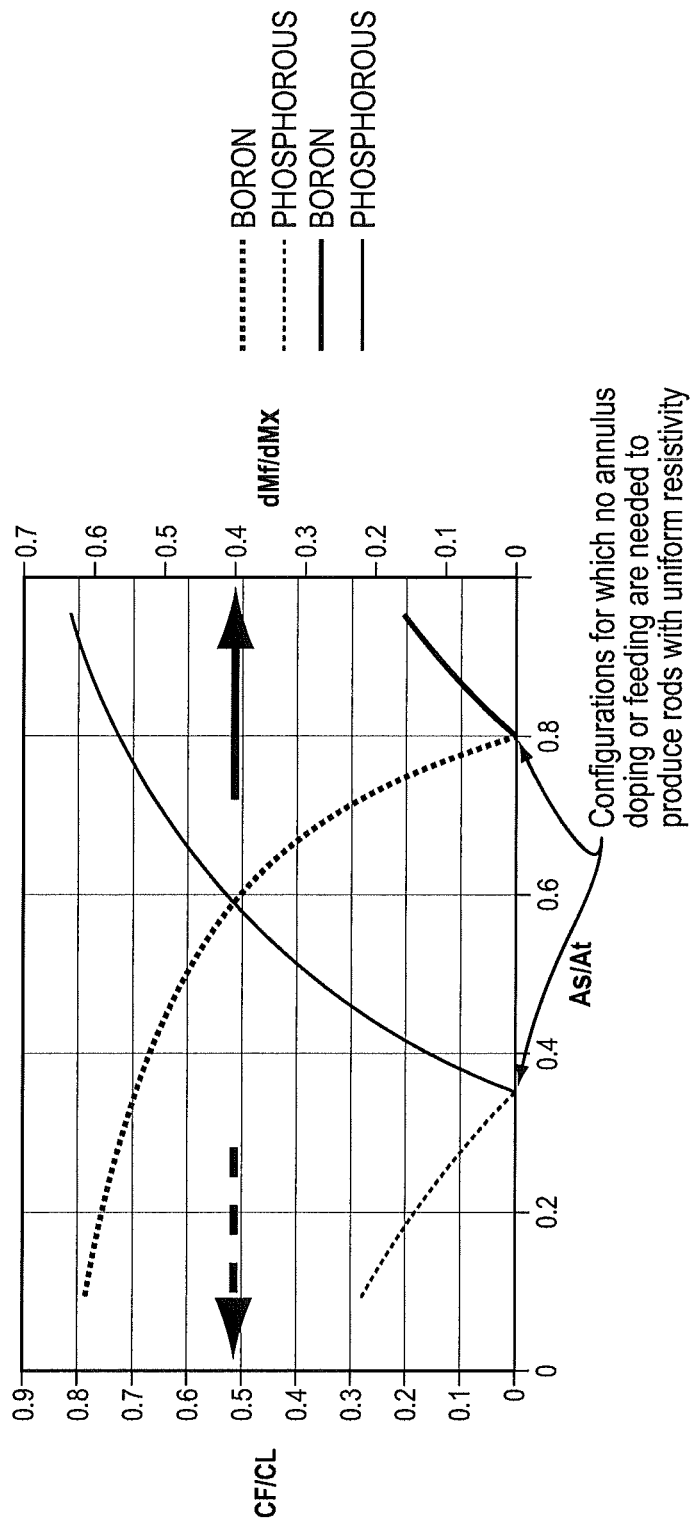
FIG. 5 shows a graph relating various process parameters and crucible geometry for embodiments of the growth system and method of the present invention.

Therefore, according to the third embodiment, in a crucible designed for a particular dopant having a segregation coefficient equaling the area ratio, the growth zone is pre-charged with both silicon and dopant material to a concentration $C_L$ when melted and the feed zone is pre-charged with only silicon to an amount providing equal initial melt levels. No continuous feed of either silicon or dopant material is needed during the ingot growth. As specific examples for a crucible having a circular cross-sectional shape, the diameter ratio of the inner growth zone diameter to outer feed zone diameter (the crucible diameter), $D_s/D_t$, has a value of 0.89 for boron and 0.59 for phosphorous. These ratios are independent of crystal growth rate or ingot diameter and may be derived from the cusps of the graph shown in FIG. 5 which shows for boron and phosphorous dopants the relationships between the crucible geometry $A_s/A_t$ and the operational parameter $dM_F/dM_x$ for the first embodiment on the right axis represented by solid lines and the operational parameter $C_F/C_L$ on the left for the second embodiment represented by dashed lines. These values can also be calculated based on the segregation coefficients of TABLE 1. The diameter ratio for gallium requires consideration of the pull rate and ingot diameter.

The special value of the area ratio can also be used to determine how a crucible having a specific geometry (or other dopant) can be used to produce a uniformly doped crystalline ingot. For example, using Eqn. 7 of the first embodiment, a value of $kA_t/A_s>1$ requires that $dM_F<0$, which is impossible unless liquid silicon can be removed from the system without removing dopant. Accordingly, the first embodiment can be practiced only for $kA_t/A_s<1$ or for the special case of $kA_t/A_s=1$. Thus, for this embodiment of the method of the present invention, a crucible having an inner growth zone and outer feed zone cross-sectional areas such that $k(A_t/A_s)<1$ and $dM_F<dM_x$ can be used to produce an ingot having an axially substantially uniform dopant concentration. As another example, using Eqn. 9 of the second embodiment, a value of $kA_t/A_s<1$ requires that $C_F<0$. However, clearly negative concentrations are impossible. Accordingly, the second embodiment can be practiced only for $kA_t/A_s>1$ or for the special case of $kA_t/A_s=1$. Thus, for this embodiment of the method of the present invention, a crucible having an inner growth zone and outer feed zone cross-sectional areas such that $k(A_t/A_s)>1$ and $C_F<C_L$ can be used to produce an ingot having an axially substantially uniform dopant concentration. Situations subject to significant evaporation, such as doping with gallium, require a strategy based on Eqns. 6 and Eqn. 8.

Because the feed rate and the solidification rate are not likely to be equal in the above embodiments, the melt level will decrease during growth and the length of ingot grown is limited by when the melt level approaches the bottom of the crucible.

The present invention provides a method of producing silicon ingots uniformly doped with a specific dopant material by growing the ingot from a crucible having an inner growth zone in fluid communication with an outer feed zone. For a crucible in which the ratio of cross-sectional areas at the level of the melt, $A_s/A_t$, equals the segregation coefficient of the dopant material, k, a uniform ingot can be grown without dopant material being included in the outer feed zone and without the need of an additional silicon or dopant feed replenishing the growth zone as the ingot grows. For any other crucible geometry, different methods are needed as described for the various embodiments of the present method. In particular, for a crucible in which $A_s/A_t>k$ (i.e., $k(A_t/A_s)<1$), in order to produce an ingot having uniform dopant concentrations, the outer feed zone should contain no dopant material and should be fed with only silicon as the ingot is grown. For this case, the rate for feeding silicon into the outer feed zone should be less than the rate the silicon ingot is grown. Also, for a crucible in which $A_s/A_t<k$ (i.e., $k(A_t/A_s)>1$), in order to produce an ingot having uniform dopant concentrations, both the inner growth zone and the outer feed zone should contain silicon and dopant, and the concentration of dopant in the outer feed zone should be less than the concentration of the dopant in the inner growth zone. No additional feed of silicon or dopant material is needed. Thus, knowing only the geometry of the crucible and the segregation coefficient of the dopant material, a uniformly doped silicon ingot may be produced using the embodiments of the method of the present invention.

A fourth embodiment combines the first and second embodiments. The outer annular feed zone is pre-charged with silicon and dopant and is continuously supplied with silicon but no dopant during growth. Although this embodiment requires the hot feeding of silicon feedstock, it does not restrict the crucible geometry and allows longer runs before the crucible is emptied. The fourth embodiment would benefit from computerized and dynamic control of the silicon replenishment.

The present invention further relates to a crystal growth system, and, in particular, a Czochralski growth system, used to prepare a crystal ingot, such as a silicon ingot having an axially substantially uniform dopant concentration. The system comprises a crucible having a known geometry and known type of dopant material. Preferably, the crystal growth system of the present invention is used to prepare the ingot using the method of the present invention, described in more detail above. Thus, preferably, the crystal growth system comprises a crucible having an inner growth zone in fluid communication with an outer feed zone, the inner growth zone comprising silicon and the dopant material which, when melted, forms a melted mixture, and the outer feed zone comprising silicon, which, when melted, forms a silicon melt. Since the growth zone and feed zone are in fluid communication, the melted mixture and the silicon melt have upper melt surfaces at substantially similar heights. The inner growth zone and the outer feed zone have cross-sectional areas that can be used to determine conditions for maintaining dopant uniformity for the specific dopant material used, and these are described in more detail above relating to the various embodiments of the method of the present invention.

Figure 6:
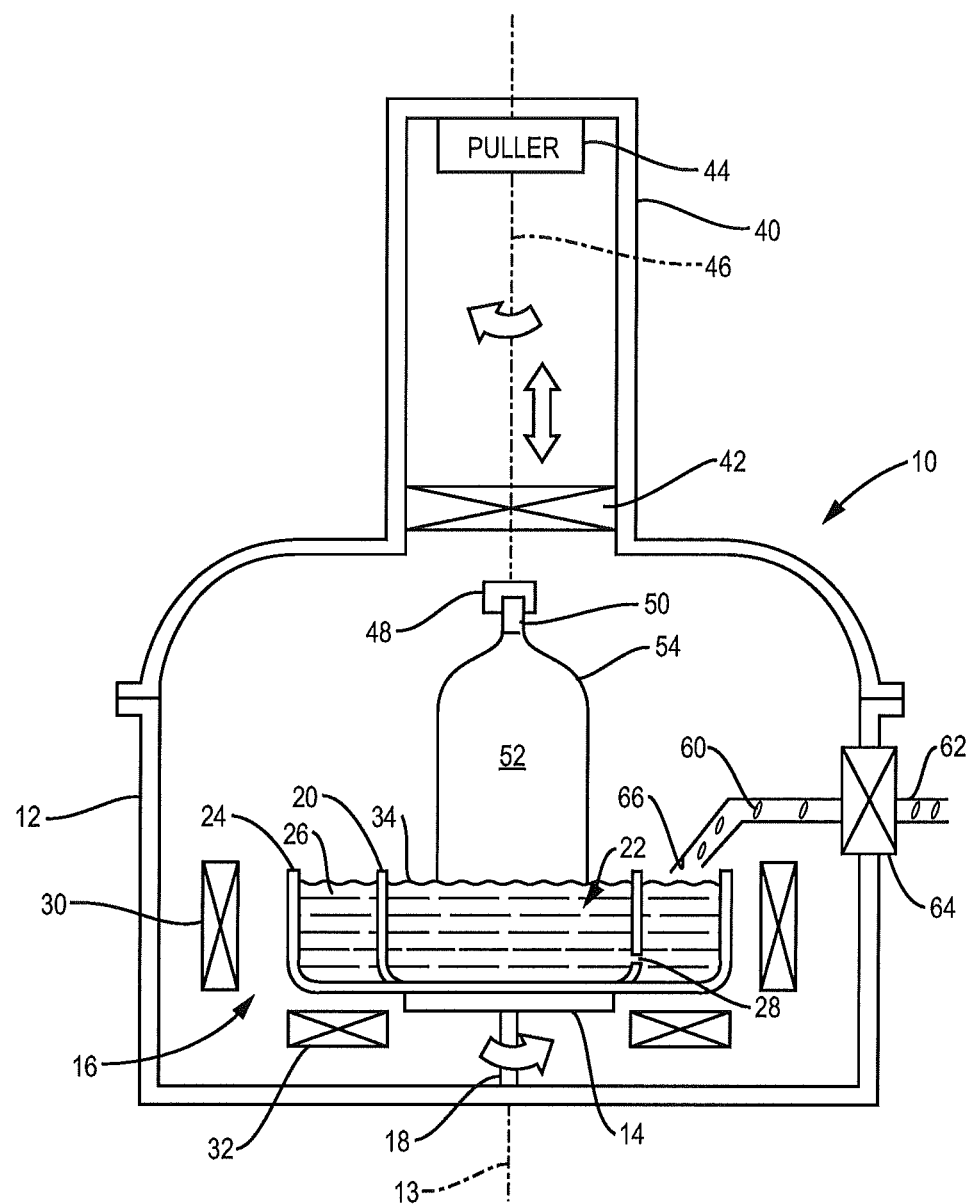
FIG. 6 is a cross-sectional view of an embodiment of a Czochralski growth system of the present invention.

A specific example of a Czochralski growth system of the present invention, and usable with for the method of the present invention as well as other uses, is schematically illustrated in the cross-sectional view of FIG. 6. Czochralski growth system 10 includes crucible chamber 12 arranged about central axis 13 and enclosing pedestal 14 supporting double-walled crucible 16 which is substantially circular in cross-sectional shape. Shaft 18 connected to an unillustrated motor rotates pedestal 14 and crucible 16 about central axis 13. Crucible chamber 12 includes ports for supplying an inert ambient gas such as argon and vacuum ports for exhausting the ambient gas and reducing the chamber pressure.

Crucible 16 includes inner wall 20 defining therein inner growth zone 22 and outer wall 24 defining, together with inner wall 20, outer annular feed zone 26. Aperture 28 in inner wall 20 provides restricted fluid communication between outer feed zone 26 and inner growth zone 22. Additional walls producing addition zones and other flow controls are possible. The diameters, and thus the cross-sectional surface areas, of inner growth zone 22 and outer feed zone 26 are preselected based on the segregation coefficient of the dopant material to be incorporated into the desired grown ingot, as discussed in more detail above. In addition, the diameter of the inner growth zone is also selected to be significantly larger than the targeting ingot diameter by an optimized factor, and the pull rate is also optimized to reduce crystal defects and other undesired effects. This optimization is well known for single-crucible CZ growth. The desired solid pre-charges comprising silicon are supplied into crucible 16, and side heater 30 and annular bottom heater 32 heat crucible 16 to approximately 1420° C., just above the melting point of silicon, so that the pre-charge melts and substantially fills inner growth zone 22 and outer feed zone 26 with molten material up to an upper melt surface level 34. Alternatively, a pre-heater can be used to melt silicon for pre-charging the crucible.

Czochralski growth system 10 further includes pull chamber 40 that extends vertically upwards from the top of crucible chamber 12 and is vacuum isolated from it by puller isolation valve 42. Puller mechanism 44 supports, retracts and extends, and rotates cable 46 having clamp 48 at its lower end to selectively hold crystalline silicon seed 50 of predetermined crystalline orientation. In operation, puller 44 lowers seed 50 through opened puller isolation valve 42 to barely contact upper melt surface 34 of inner growth zone 22. Under the proper temperature conditions, the silicon at the surface of the melt in the inner growth zone freezes or solidifies on seed 50 with the same crystalline orientation as that of the seed. Puller 44 then slowly raises seed 50 from the melt as the seed and crucible 16 are rotated in opposite directions such that additional silicon freezes and the crystal expands to form growing ingot 52. In an initial period, the diameter of ingot 52 expands in crown region 54, but the drawing rate is then increased so that the central portion of the ingot 52 has a substantially constant diameter, for example, 200 or 300 mm.

As the length of ingot 52 increases, it is partially pulled into pull chamber 40. When a final length of the ingot has been achieved, for example, 1 to 2 meters, the pull rate is further increased to create an ingot tail of decreasing diameter which eventually breaks from the melt. Ingot 52 is then completely pulled into pull chamber 40, and puller isolation valve 42 closes to isolate the pull chamber from the crucible chamber. When the ingot has sufficiently cooled, it is removed from pull chamber 40, and a new seed can be clamped to puller cable 46 so that a subsequent ingot may be drawn from the same hot crucible if sufficient melt remains.

If required, additional silicon can be delivered to crucible 16 at least intermittently during the drawing of ingot 52 or between ingots. In the embodiment of FIG. 1, solid silicon particles 60 in the form of shards or pellets are supplied by feeder tray 62 selectively penetrating the sidewall of crucible chamber 12 through feeder isolation valve 64. Feeder tray 62, which may be contained in its own isolation chamber and be selectively activated by a vibrator, can be withdrawn from crucible chamber 12 and the feeder isolation valve closed to allow resupply of feedstock to the feeder tray or its servicing. Feeder tray 62 may be positioned over an inclined chute having spout 66 positioned closely over rotating outer feed zone 26 to drop particles 60 at low velocity into outer feed zone 26, in which they melt and eventually are supplied through aperture 28 into inner growth zone 22 to maintain upper melt surface level 34.

Although the invention has been described for a two-zone crucible with one apertured separating wall, the invention can be readily extended to crucibles having more than two zones with multiple apertured separating walls providing limited fluid communication from the outermost zones to the innermost growth zone.

Some aspects of the invention can be easily expanded to the use of multiple dopants, perhaps of differing conductivity types, by accounting for their separate segregation coefficients.

Although the above derivations provide a basis for fixed feed and pull rates, it is understood that a computerized controller can monitor system operation and adjust the feed and pull rates accordingly.

Although the invention offers significant commercial importance for growing monocrystalline silicon ingots, it may be applied to the growth of other materials and crystallographies.

The foregoing description of preferred embodiments of the present invention has been presented for the purposes of illustration and description. It is not intended to be exhaustive or to limit the invention to the precise form disclosed, Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A continuous Czochralski growth method for growing a silicon ingot comprising a dopant material having a segregation coefficient of k, the method comprising the steps of:

i) providing a crucible having an inner growth zone in fluid communication with an outer feed zone, wherein the inner growth zone and the outer feed zone have cross-sectional areas that are preselected based on the segregation coefficient k of the dopant material;

ii) providing an initial charge in the inner growth zone and the outer feed zone prior to initiating growth, the initial charge in the inner growth zone comprising silicon and the dopant material and the initial charge in the outer feed zone comprising silicon and no dopant material;

iii) once the initial charge to the inner growth zone and the outer feed zone has been provided, melting the silicon and dopant material in the inner growth zone to form a melted mixture and the silicon in the outer feed zone to form a silicon melt, the melted mixture and the silicon melt having upper melt surfaces at substantially similar heights, wherein the inner growth zone has a cross-sectional surface area As at the upper melt surface of the melted mixture and the crucible has a total cross-sectional surface area $A_t$ at the upper melt surface area of the melted mixture and the silicon melt;

iv) growing the silicon ingot to an amount $M_x$ from the inner growth zone, wherein during the growing, a feed comprising silicon and no dopant material in an amount $M_F$ is delivered at a feed rate into the silicon melt in the outer feed zone, wherein the feed rate at which the feed is delivered is based on a) the cross-sectional areas of the inner growth zone and the outer feed zone and b) the segregation coefficient k of the dopant material in the initial charge, wherein a ratio of the feed rate to an ingot growth rate of the silicon ingot is equal to $1-k(A_f/A_s)$, and wherein no additional dopant is supplied to the inner growth zone and the outer feed zone after providing the initial charge until the silicon ingot is grown to the amount $M_x$; and v) removing the grown silicon ingot comprising the dopant material in an axially substantially constant concentration.

2. The method of claim 1, wherein the crucible is substantially circular in cross-sectional shape.

3. The method of claim 1, wherein the inner growth zone is in fluid communication with the outer feed zone through at least one apertured wall.

* * * * *